United States Patent
Kitajima et al.

(10) Patent No.: US 6,744,183 B2
(45) Date of Patent: Jun. 1, 2004

(54) METHOD OF BONDING PIEZOELECTRIC ELEMENT AND ELECTRODE, AND PIEZOELECTRIC MICROACTUATOR USING THE BONDING METHOD

(75) Inventors: Masayuki Kitajima, Kawasaki (JP); Yutaka Noda, Kawasaki (JP); Seiichi Shimoura, Kawasaki (JP); Toru Okada, Kawasaki (JP); Masanao Fujii, Kawasaki (JP); Kenji Iketaki, Kawasaki (JP); Hidehiko Kobayashi, Kawasaki (JP); Masakazu Takesue, Kawasaki (JP); Keiichi Yamamoto, Kawasaki (JP); Hisao Tanaka, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/347,708

(22) Filed: Jan. 21, 2003

(65) Prior Publication Data

US 2003/0137223 A1 Jul. 24, 2003

Related U.S. Application Data

(62) Division of application No. 09/822,636, filed on Mar. 30, 2001, now Pat. No. 6,541,898.

(30) Foreign Application Priority Data

Nov. 2, 2000 (JP) ......................................... 2000-335867

(51) Int. Cl.[7] ............................................. H01L 41/047

(52) U.S. Cl. ........................ 310/363; 310/364; 29/25.35

(58) Field of Search ................................ 310/363, 364; 29/25.35

(56) References Cited

U.S. PATENT DOCUMENTS

| 2,983,823 | A | * | 5/1961 | Oberly | 250/214.1 |
| 3,488,530 | A | * | 1/1970 | Staudte | 310/348 |
| 4,491,562 | A | * | 1/1985 | Soga et al. | 420/589 |
| 5,113,566 | A | | 5/1992 | Weekamp et al. | 29/25.35 |
| 5,327,013 | A | * | 7/1994 | Moore et al. | 257/772 |
| 6,252,337 | B1 | | 6/2001 | Tanaka | 310/364 |
| 6,291,931 | B1 | | 9/2001 | Lakin | 310/364 |
| 6,541,898 | B2 | * | 4/2003 | Kitajima et al. | 310/363 |
| 6,598,779 | B2 | * | 7/2003 | Morimoto et al. | 228/180.22 |

FOREIGN PATENT DOCUMENTS

| JP | 54-132187 | | 10/1979 | H03H/9/04 |
| JP | 63-143883 | | 6/1988 | H01L/41/08 |
| JP | 6-224674 | | 8/1994 | H03H/3/02 |
| JP | 8-197730 | * | 8/1996 | B41J/2/045 |
| JP | 10-293979 | | 11/1998 | G11B/21/10 |
| JP | 11-031368 | | 2/1999 | G11B/21/10 |
| JP | 11-163434 | * | 6/1999 | H01L/41/022 |
| JP | 2001-358452 | * | 12/2001 | H05K/3/34 |
| WO | WO00/59074 | | 10/2000 | H01R/11/01 |

* cited by examiner

Primary Examiner—Thomas M. Dougherty
(74) Attorney, Agent, or Firm—Greer, Burns & Crain, Ltd.

(57) ABSTRACT

A method of bonding a piezoelectric element and an electrode, including the steps of forming a first coating of a material selected from the group consisting of Au, Al, Zn, Cu, and Sn on a bonding surface of the piezoelectric element, and forming a second coating of a material selected from the group consisting of Au, Al, Zn, Cu, and Sn on a bonding surface of the electrode. The combination of the materials of the first and second coatings is preferably Au/Au, Au/Al, Zn/Cu, or Sn/Cu. The method further includes the step of bringing the first and second coatings into close contact with each other and heating them under pressure to form a metallic bond or intermetallic compound between the first and second coatings, thereby bonding the piezoelectric element and the electrode.

2 Claims, 9 Drawing Sheets

METHOD OF BONDING PIEZOELECTRIC ELEMENT AND ELECTRODE, AND PIEZOELECTRIC MICROACTUATOR USING THE BONDING METHOD

This is a divisional of application Ser. No. 09/822,636, filed Mar. 30, 2001, now U.S. Pat. No. 6,541,898.

BACKGROUND OF THE INVENTION

1. Field of the Invention

The present invention relates to a method of bonding a piezoelectric element and an electrode, and a piezoelectric microactuator using the bonding method.

2. Description of the Related Art

In recent years, a magnetic disk drive as a kind of external storage for a computer has become increasingly smaller and thinner, and has been required to reduce its power consumption. Further, high-density and large-capacity recording has also been required in the magnetic disk drive. In general, the large-capacity recording in the magnetic disk drive can be realized by increasing a recording capacity per disk. However, in the case of increasing a recording density without changing the diameter of the disk, the track pitch is decreased to raise a technical problem such that how precisely the positioning of a head element for reading and writing information on a recording track is performed. It is therefore desired to provide a head actuator having a good positioning accuracy.

To perform high-precision head positioning in a conventional magnetic disk drive, it has generally been tried to improve the rigidity of a movable portion such as an actuator arm, thereby improving a primary resonant frequency in the horizontal direction of the movable portion. However, there is a limit to the improvement in the resonant frequency. Even if the resonant frequency in the horizontal direction of the movable portion can be greatly improved, there occur vibrations due to the spring characteristic of a bearing for supporting the movable portion, thus causing a reduction in head positioning accuracy.

As one of means for solving these problems, a so-called double actuator has been proposed. The double actuator is configured by mounting a second actuator for following a track, i.e., a tracking actuator on a front end portion of the arm of the head actuator. The tracking actuator is operated independently of the head actuator to finely move a head provided at the front end of the tracking actuator, thereby attaining the tracking of the head.

As the tracking actuator in the double actuator, an actuator using a laminated type piezoelectric element has been proposed to attain precise positioning of the head. For example, two laminated type piezoelectric elements are located on the opposite sides of an actuator arm, and a voltage is applied to the piezoelectric elements in such a direction that one of the piezoelectric elements is expanded and the other piezoelectric element is contracted. As a result, the head is rotated toward the side where the piezoelectric element contracted is located.

In the conventional two-stage actuator using the laminated type piezoelectric elements, however, there is a possibility that a voltage may be applied in a direction opposite to the polarization direction of each piezoelectric element, that the piezoelectric elements may be exposed to a high-temperature atmosphere, or that the piezoelectric elements may be changed with time, for example. As a result, the piezoelectric elements are depolarized to cause a gradual decrease in displacement per unit voltage. Accordingly, a desired stroke cannot be obtained after long-time use. Further, the conventional two-stage actuator using the laminated type piezoelectric elements has another drawback such that the manufacturability of the piezoelectric elements is low and the accuracy of the outer dimensions of each piezoelectric element is necessary to cause a cost increase.

Another two-stage actuator using a shear type piezoelectric element in place of the above-mentioned laminated type piezoelectric element having many drawbacks has been proposed in Japanese Patent Laid-open Nos. 10-293979 and 11-31368. Japanese Patent Laid-open No. 11-31368 discloses a microscopic moving mechanism for a head. This mechanism has a three-layer structure such that an electrode is formed on the front end of a head arm, that two shear type piezoelectric elements having different polarization directions are mounted on the electrode, and that a movable member is mounted on the piezoelectric elements. A head suspension is mounted on the movable member.

Accordingly, as compared with the thickness of only a spacer interposed between a head arm and a suspension as a conventional structure, the thickness of the above three-layer structure between the head arm and the suspension is larger, so that this mechanism is not suitable for a reduction in thickness of the head actuator. Further, such an increase in thickness between the head arm and the suspension causes an increase in spacing between opposed disk surfaces. Accordingly, the number of disks that can be mounted in a disk drive is decreased, and as a result the storage capacity becomes smaller than that in a disk drive having the same height.

The present applicant has proposed an improved microscopic moving mechanism for a head which can solve the above problem. In this mechanism proposed by the present applicant, an actuator base bent like a crank is fixed to a front end portion of an actuator arm. A multilayer structure composed of a base electrode, shear type piezoelectric elements, a movable electrode, and a movable plate is fixed to the actuator base, and a suspension is fixed to the movable plate. Since the actuator base is bent like a crank, the upper surface of the actuator base and the upper surface of the movable plate can be made flush with each other, thereby reducing the thickness of a microscopic moving mechanism for a head using shear type piezoelectric elements.

In the above mechanism proposed by the present applicant, the piezoelectric elements and the base electrode must be electrically connected, and the piezoelectric elements and the movable electrode must be electrically connected. To this end, a conductive adhesive is used to fix the piezoelectric elements to the base electrode and the movable electrode. On the other hand, the actuator base and the base electrode must be insulated from each other, and the movable electrode and the movable plate must be insulated from each other. To this end, a usual insulating adhesive is used to fix the actuator base and the base electrode and to fix the movable electrode and the movable plate.

The use of the conductive adhesive is intended to ensure reliable bonding between the piezoelectric elements and the base electrode and between the piezoelectric elements and the movable electrode. However, since each piezoelectric element has a thickness of 0.15 mm, there is a possibility that a short circuit may be generated between the base electrode and the movable electrode because of working error or the like. Further, a curing period of about 3 minutes at 150° C. is required for the conductive adhesive, thus greatly reducing the productivity. In addition, distortion remains in curing the conductive adhesive because it is formed of resin.

SUMMARY OF THE INVENTION

It is therefore an object of the present invention to provide a method of bonding a piezoelectric element and an electrode which can reliably bond the piezoelectric element and the electrode without the occurrence of a short circuit or the like.

It is another object of the present invention to provide a piezoelectric microactuator which can easily and reliably attain the bonding between a piezoelectric element and an electrode.

In accordance with an aspect of the present invention, there is provided a method of bonding a piezoelectric element and an electrode, comprising the steps of forming a first coating of a material selected from the group consisting of Au, Al, Zn, Cu, and Sn on a bonding surface of said piezoelectric element; forming a second coating of a material selected from the group consisting of Au, Al, Zn, Cu, and Sn on a bonding surface of said electrode; and bringing said first and second coatings into close contact with each other and heating them under pressure to form a metallic bond or intermetallic compound between said first and second coatings. Preferably, the combination of said materials of said first and second coatings is Au/Au, Au/Al, Zn/Cu, or Sn/Cu.

Preferably, each of said first and second coatings has a thickness of 1 µm or more. Preferably, the method further comprises the step of ultrasonically vibrating at least one of said piezoelectric element and said electrode under the condition where said piezoelectric element and said electrode are kept in close contact with each other, before said step of heating them under pressure. Alternatively, the method may further comprise the step of irradiating at least one of said first and second coatings with a plasma selected from the group consisting of $O_2$, Ar, $N_2$, $SF_6$, and $CF_4$, before said step of heating them under pressure.

In accordance with another aspect of the present invention, there is provided a piezoelectric microactuator comprising an actuator base; a base electrode fixed to said actuator base; first and second shear type piezoelectric elements bonded to said base electrode by a first metallic bond of Au/Au or by a first intermetallic compound selected from the group consisting of Au/Al, Zn/Cu, and Sn/Cu, said first and second piezoelectric elements having polarization directions perpendicular to the direction of their thicknesses and opposite to each other; a movable electrode bonded to said first and second piezoelectric elements by a second metallic bond of Au/Au or by a second intermetallic compound selected from the group consisting of Au/Al, Zn/Cu, and Sn/Cu; and a movable plate fixed to said movable electrode.

In accordance with a further aspect of the present invention, there is provided a piezoelectric microactuator comprising an actuator base; a base electrode fixed to said actuator base; first and second shear type piezoelectric elements bonded to said base electrode by a metallic bond of Au/Au or by an intermetallic compound selected from the group consisting of Au/Al, Zn/Cu, and Sn/Cu, said first and second piezoelectric elements having polarization directions perpendicular to the direction of their thicknesses and opposite to each other; a movable plate fixed to said first and second piezoelectric elements; a first wire for connecting said first and second piezoelectric elements; and a second wire for connecting one of said first and second piezoelectric elements to said base electrode; said base electrode having a first conductor pattern electrically connected through said metallic bond or said intermetallic compound to said first and second piezoelectric elements, and a second conductor pattern electrically independent of said first conductor pattern and connected to said second wire.

In accordance with a still further aspect of the present invention, there is provided a method of bonding a piezoelectric element and an electrode, comprising the steps of preparing a Sn—Pb solder containing 0.1 to 10 wt. % of a material selected from the group consisting of Ag, Bi, Sb, Ge, and Ni; and soldering said piezoelectric element and said electrode by using said Sn—Pb solder.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
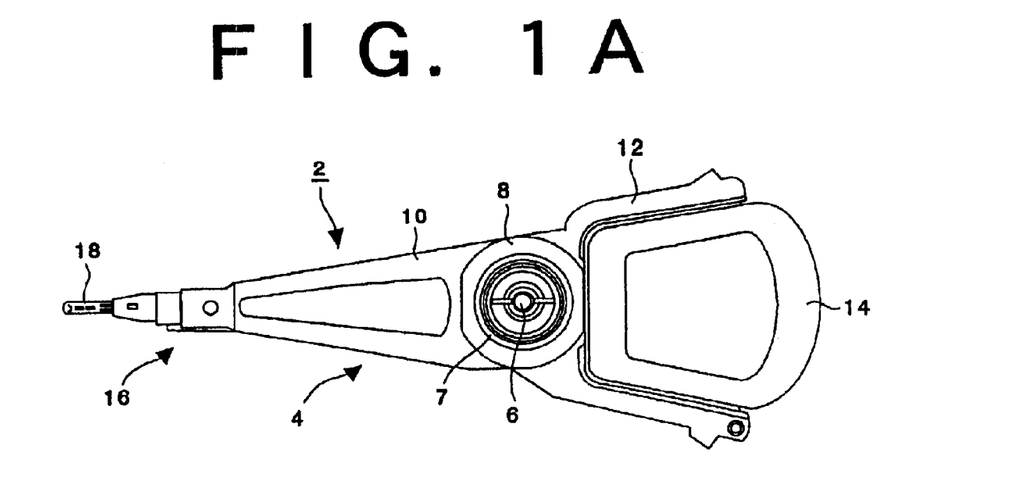
FIGS. 1A and 1B are a plan view and side view of a double actuator using the piezoelectric microactuator of the present invention, respectively.
Figure 1B:
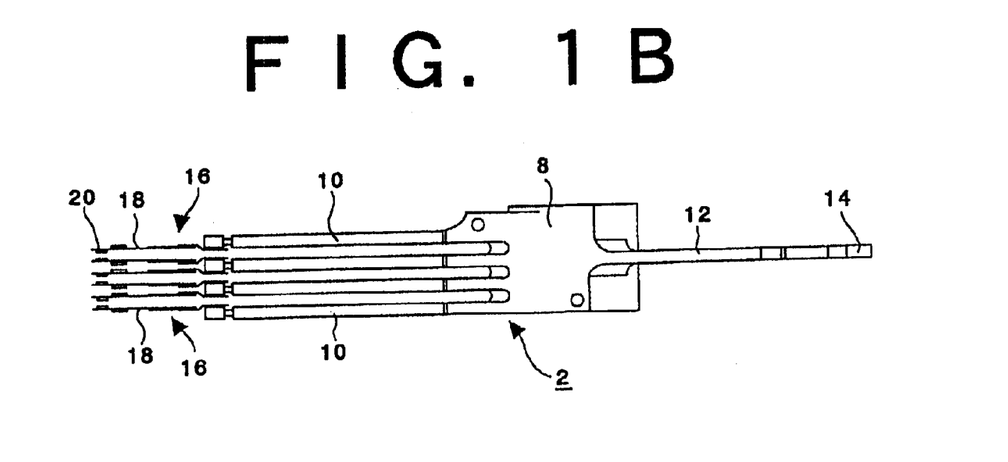

Some preferred embodiments of the present invention will now be described in detail with reference to the drawings. Referring to FIG. 1A, there is shown a plan view of a two-stage head actuator 2 adopting the piezoelectric microactuator of the present invention as a tracking actuator. FIG. 1B is a side view of the two-stage head actuator 2 shown in FIG. 1A.

The two-stage head actuator 2 is composed generally of an actuator assembly 4 and a magnetic circuit (not shown). The actuator assembly 4 is rotatably mounted on a shaft 6 fixed to a base (not shown) of a magnetic disk drive. The actuator assembly 4 includes an actuator block 8 rotatably mounted on the shaft 6 through a bearing 7, a plurality of actuator arms 10 formed integrally with the actuator block 8 and extending therefrom in one direction, and a coil supporting member 12 extending from the actuator block 8 in a direction opposite to the direction of extension of the actuator arms 10.

A flat coil 14 is supported to the coil supporting member 12. The magnetic circuit (not shown) fixed to the base of the magnetic disk drive and the flat coil 14 inserted in a gap defined in the magnetic circuit constitute a voice coil motor (VCM). A piezoelectric microactuator 16 according to a first preferred embodiment of the present invention is mounted on a front end portion of each actuator arm 10, and a suspension 18 is fixed at its base end portion to each piezoelectric microactuator 16. A magnetic head 20 is supported to a front end portion of each suspension 18.

Figure 2:
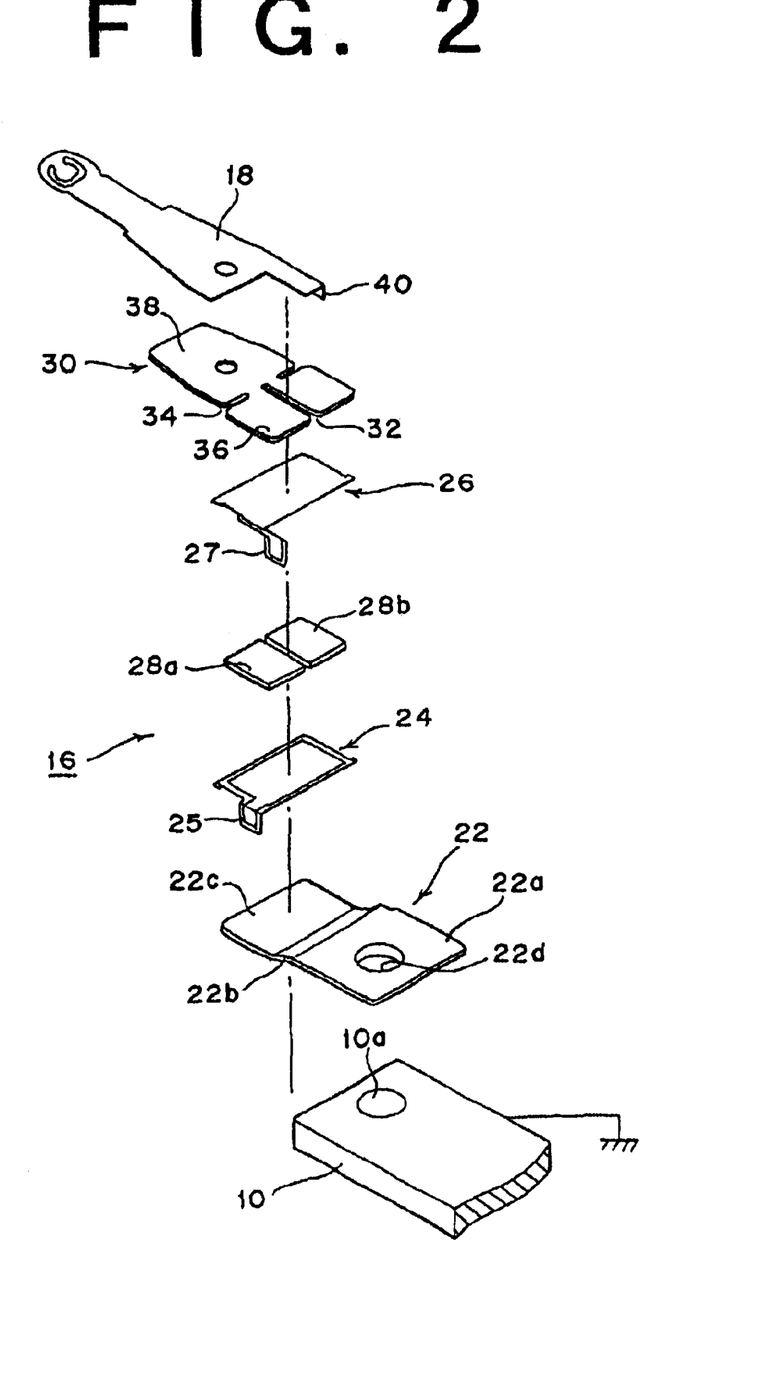
FIG. 2 is an exploded perspective view of a piezoelectric microactuator according to a first preferred embodiment of the present invention.

Referring to FIG. 2, there is shown an exploded perspective view of the piezoelectric microactuator 16 according to the first preferred embodiment. The piezoelectric microactuator 16 includes an actuator base 22, a base electrode 24, a movable electrode 26, a pair of shear type piezoelectric elements 28a and 28b, and a movable plate 30. The actuator base 22 has a base end portion 22a, a shoulder portion 22b, and a front end portion 22c. The base end portion 22a of the actuator base 22 is integrally formed with a projection 22d. The projection 22d of the actuator base 22 is inserted into a hole 10a formed on the actuator arm 10 and crimped to the actuator arm 10. The actuator arm 10 is grounded.

The front end portion 22c of the actuator base 22 is formed contiguously from the base end portion 22a through the shoulder portion 22b in such a manner that the level of the front end portion 22c is made lower than the level of the base end portion 22a by the shoulder portion 22b. The shear type piezoelectric elements 28a and 28b are sandwiched between the base electrode 24 and the movable electrode 26, and the base electrode 24 is mounted on the front end portion 22c of the actuator base 22. The piezoelectric elements 28a and 28b are arranged in parallel in the same plane, and have polarization directions perpendicular to the direction of their thicknesses and opposite to each other. The polarization directions are parallel to the longitudinal direction of the actuator arm 10. The upper and lower surfaces of each of the piezoelectric elements 28a and 28b are coated with gold as will be hereinafter described.

The base electrode 24 is formed with a tab (wiring lead portion) 25 projecting from one side of the front end portion 22c of the actuator base 22. Similarly, the movable electrode 26 is formed with a tab 27 projecting from the one side of the front end portion 22c of the actuator base 22. The movable plate 30 has a base portion 36 defined by a first slit 32 and a second slit 34, and a displacement enlarging portion 38 extending from the front end of the base portion 36. The base portion 36 of the movable plate 30 is mounted on the movable electrode 26. The suspension 18 is fixed at its base portion to the displacement enlarging portion 38 of the movable plate 30 by spot welding or the like. Reference numeral 40 denotes a relay FPC mounting portion formed on one side of the base portion of the suspension 18 for supplying a current to the magnetic head 20.

Figure 3A:
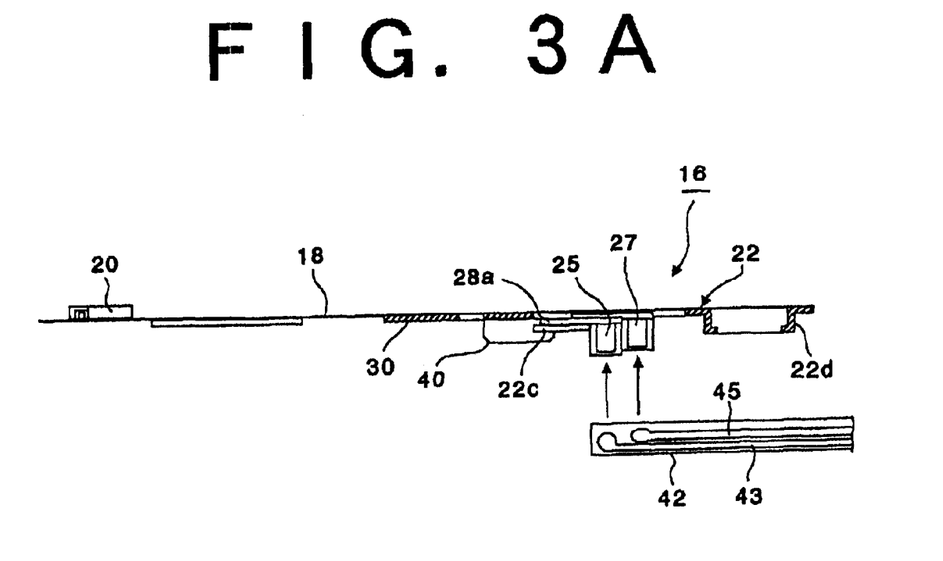
FIGS. 3A and 3B are a side view and plan view of a head assembly adopting the piezoelectric microactuator according to the first preferred embodiment, respectively.
Figure 3B:
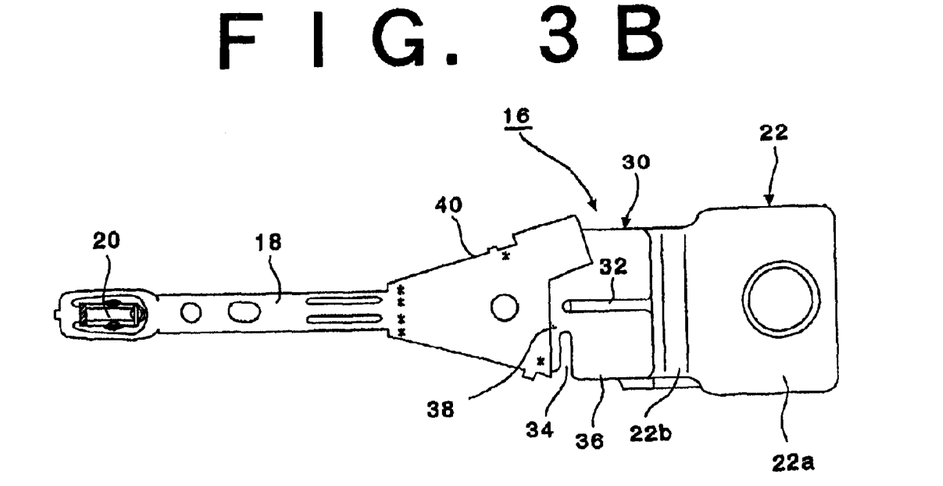

Referring to FIG. 3A, there is shown a side view of a head assembly adopting the piezoelectric microactuator 16 according to the first preferred embodiment. FIG. 3B is a plan view of the head assembly shown in FIG. 3A. In the assembled condition of the piezoelectric microactuator 16 as shown in FIG. 3A, the tab 25 of the base electrode 24 and the tab 27 of the movable electrode 26 are arranged in adjacent relationship with each other. As a result, a pair of lead patterns 43 and 45 formed on a relay FPC 42 can be easily soldered to the tabs 25 and 27, respectively, so that a voltage can be simply applied between the base electrode 24 and the movable electrode 26.

Figure 4:
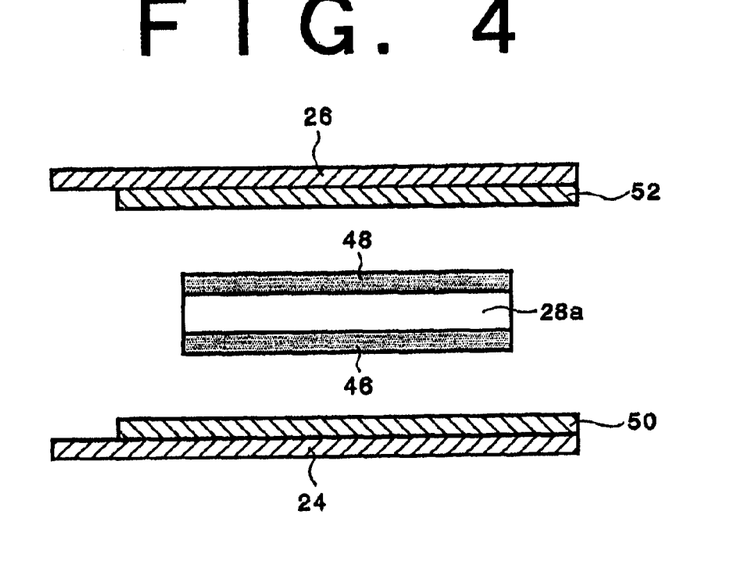
FIG. 4 is an enlarged sectional view of bonding portions between a piezoelectric element and electrodes in the first preferred embodiment.
Figure 5:
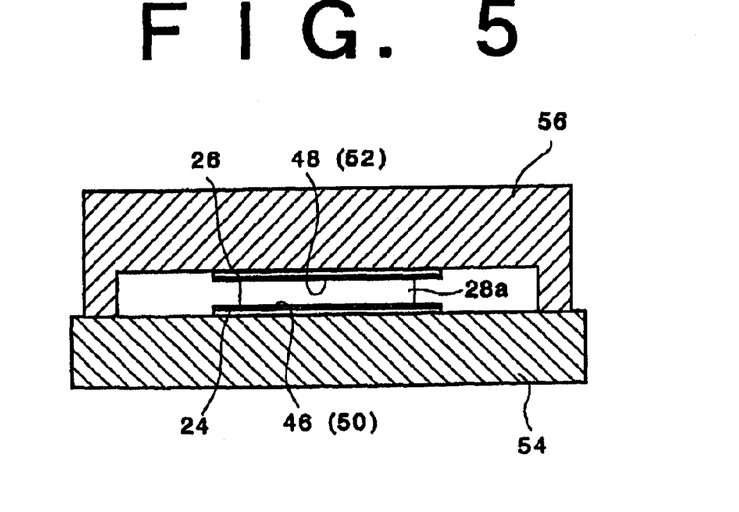
FIG. 5 is a sectional view for illustrating a pressure heating step.

Referring to FIG. 4, there is shown an enlarged sectional view of bonding portions between the piezoelectric element 28a and the electrodes 24 and 26 in the first preferred embodiment. Although not shown, bonding portions between the piezoelectric element 28b and the electrodes 24 and 26 are similar to those shown in FIG. 4. Gold coatings 46 and 48 each having a thickness of 1 $\mu$m are formed on the upper and lower surfaces of the piezoelectric element 28a, respectively, by vapor deposition or plating. On the other hand, an aluminum coating 50 having a thickness of 3 $\mu$m is formed on the bonding surface (upper surface) of the base electrode 24 by vapor deposition or plating. Similarly, an aluminum coating 52 having a thickness of 3 $\mu$m is formed on the bonding surface (lower surface) of the movable electrode 26. The laminate of the base electrode 24, the piezoelectric elements 28a and 28b, and the movable electrode 26 as shown in FIG. 4 is placed between a stage 54 and a head 56 as shown in FIG. 5 to perform bonding operation.

In an experiment, the stage 54 was heated to 290° C. and the head 56 was heated to 180° C. as applying a load of 7.28 kg to the head 56. At this time, the temperature of the laminate was about 200° C. This condition was kept for about 90 seconds to form an intermetallic compound between the gold coating 46 and the aluminum coating 50 and an intermetallic compound between the gold coating 48 and the aluminum coating 52. As a result, the base electrode 24 and the piezoelectric elements 28a and 28b could be bonded by the intermetallic compound formed between the gold coating 46 and the aluminum coating 50. Similarly, the movable electrode 26 and the piezoelectric elements 28a and 28b could be bonded by the intermetallic compound formed between the gold coating 48 and the aluminum coating 52.

The thickness of each intermetallic compound layer was about 2 $\mu$m, and the bonding strength per size of each piezoelectric element was 6.552 kg. The size of each piezoelectric element was 2.2×1.3 mm, so that the bonding strength per unit area was expressed as 2.29 kg/mm². The materials of the coatings 46 and 48 are not limited to gold (Au), and the materials of the coatings 50 and 52 are not limited to aluminum (Al), but the materials of the coatings 46, 48, 50, and 52 are selected from the group consisting of Au, Al, Zn, Cu, and Sn according to the present invention. Preferably, the combination of the materials of the coatings 46 and 50 is set to Au/Au, Au/Al, Zn/Cu, or Sn/Cu. Similarly, the combination of the materials of the coatings 48 and 52 is preferably set to Au/Au, Au/Al, Zn/Cu, or Sn/Cu.

There is a possibility that the surfaces of the coatings 46, 48, 50, and 52 may be stained. It is therefore preferable to clean each coating surface by irradiating each coating surface with a plasma selected from the group consisting of $O_2$, Ar, $N_2$, $SF_6$, and $CF_4$. In an experiment, each of the coatings 46, 48, 50, and 52 was irradiated with an $O_2$ plasma gas under a vacuum of $10^{-3}$ Torr at an output of 10 W for 10 minutes, and thereafter subjected to the above-mentioned pressure heating step. As a result, the base electrode 24 and the movable electrode 26 could be firmly and reliably bonded to the piezoelectric elements 28a and 28b.

Figure 6:
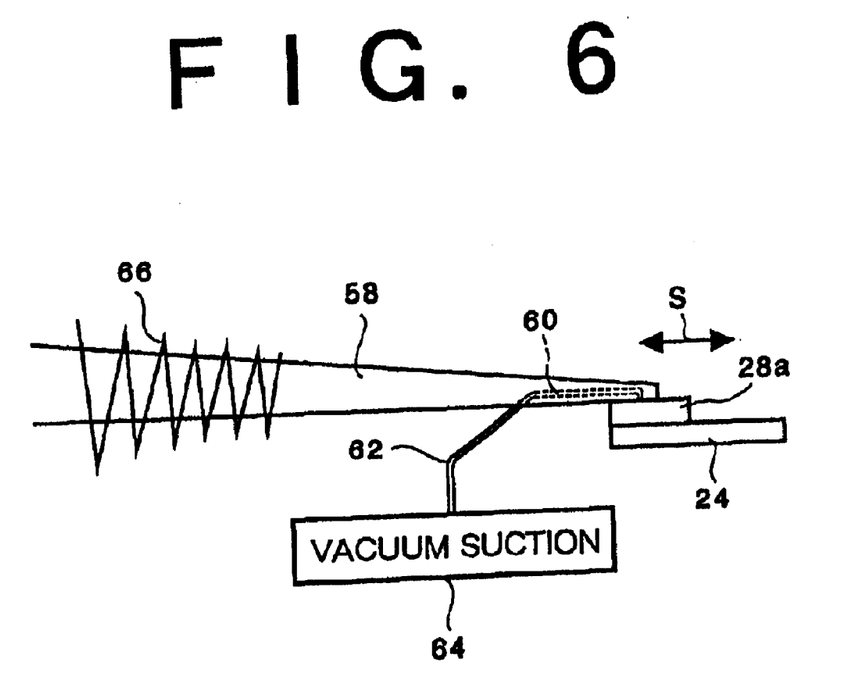
FIG. 6 is a schematic view for illustrating ultrasonic treatment.

Referring to FIG. 6, there is shown a schematic view of a preferred embodiment of the present invention in which the bonding surface of each coating is subjected to ultrasonic treatment. As shown in FIG. 6, a head 58 having an ultrasonic horn 66 is used. The head 58 is formed with a conduit 60. One end of the conduit 60 opens to a suction surface (lower surface) of the head 58 at its front end portion for sucking the upper surface of the piezoelectric element 28a. The other end of the conduit 60 is connected through a tube 62 to vacuum suction means 64. In an experiment, the head 58 was ultrasonically vibrated at an output of 29 W for 45 seconds under the condition where the vacuum suction means 64 was operated. As a result, the piezoelectric element 28a was sucked to the head 58 by the suction vacuum, and was vibrated in the direction of an arrow S. Accordingly, the coatings 46 and 50 between the base electrode 24 and the piezoelectric element 28a rub against each other to remove oxide films formed on the coatings 46 and 50, thus cleaning the coating surfaces. Furthermore, the bonding surfaces of the coatings 46 and 50 are heated by the ultrasonic vibration.

After the above ultrasonic treatment, the base electrode 24 was placed on the stage 54 shown in FIG. 5, and the stage 54 was heated to 290° C. In this case, the bonding portion between the base electrode 24 and the piezoelectric element 28a was heated to 200° C. without heating the head 56. A load of 2.18 kg was applied to the head 56 for 90 seconds to bond the base electrode 24 and the piezoelectric element 28a. As a result, a bonding strength per size of the piezoelectric element 28a was 10.083 kg. The size of the piezoelectric element 28a was set to 2.2×1.3 mm, so that a bonding strength per unit area was expressed as 3.53 kg/mm². The thickness of each gold coating was 1 $\mu$m, and the thickness of each aluminum coating was 3 $\mu$m as in the first preferred embodiment. Then, the thickness of each intermetallic compound layer was about 2 $\mu$m as in the first preferred embodiment.

Figure 7:
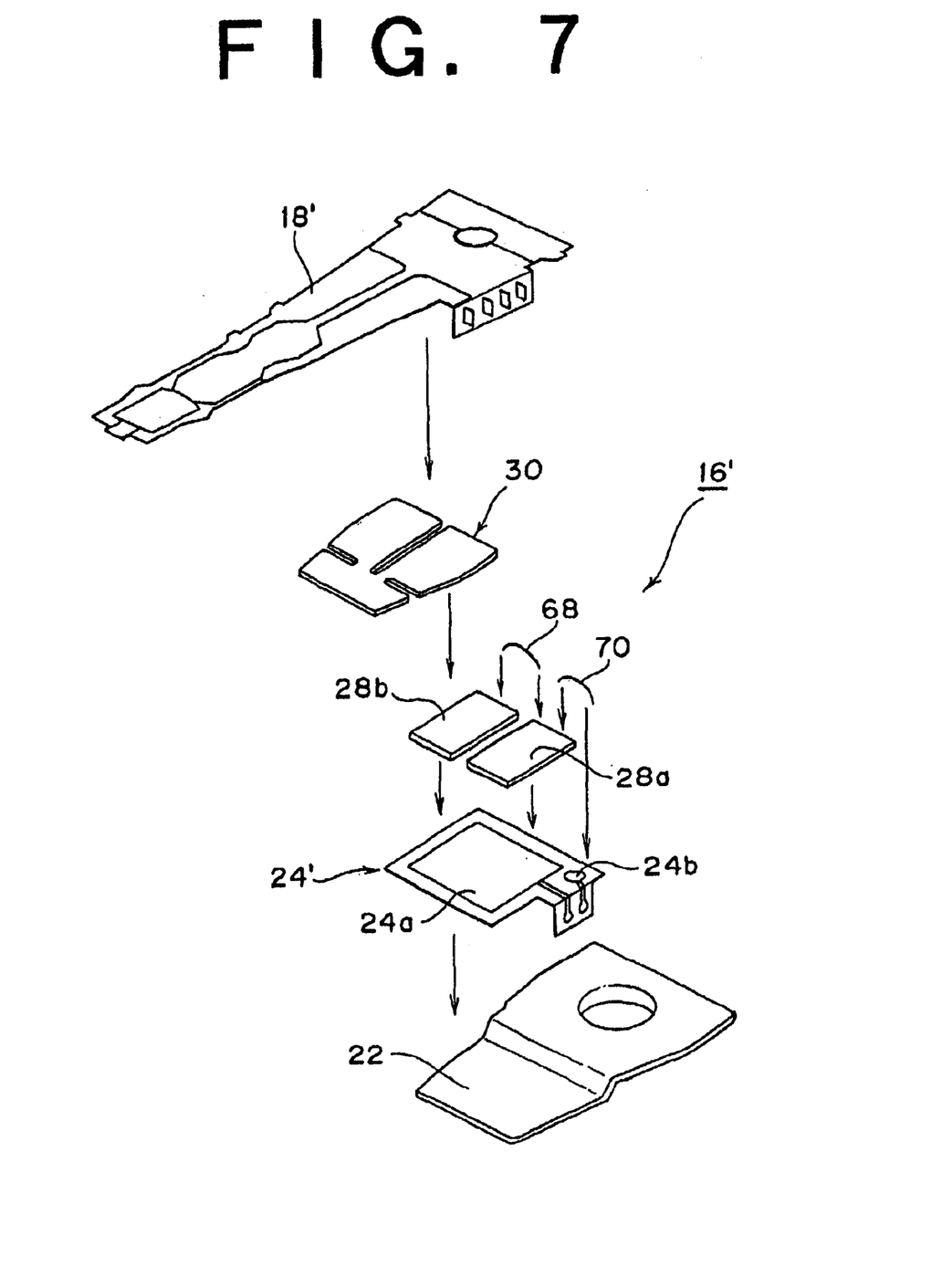
FIG. 7 is an exploded perspective view of a piezoelectric microactuator according to a second preferred embodiment of the present invention.

Referring next to FIG. 7, there is shown an exploded perspective view of a piezoelectric microactuator 16' according to a second preferred embodiment of the present invention. The piezoelectric microactuator 16' includes an actuator base 22, a base electrode 24', a pair of piezoelectric elements 28a and 28b, first and second wires 68 and 70, and a movable plate 30. The base electrode 24' is fixed to the actuator base 22. The base electrode 24' has a first conductor pattern 24a having a larger area and a second conductor pattern 24b having a smaller area. The first and second conductor patterns 24a and 24b are independent of each other. The piezoelectric elements 28a and 28b are bonded to the base electrode 24' by intermetallic compounds similar to those in the first preferred embodiment. The piezoelectric elements 28a and 28b are connected together by bonding the first wire 68. The piezoelectric element 28a and the second conductor pattern 24b of the base electrode 24 are connected together by bonding the second wire 70.

The movable plate 30 is fixed to the piezoelectric elements 28a and 28b. A suspension 18' is fixed at its base end portion to the movable plate 30 by spot welding or the like. Thus, the piezoelectric microactuator 16' according to the second preferred embodiment differs from the piezoelectric microactuator 16 according to the first preferred embodiment in that the movable electrode 26 of the piezoelectric microactuator 16 is eliminated and the piezoelectric elements 28a and 28b are connected to the conductor pattern 24b of the base electrode 24' by the two wires 68 and 70.

Figure 8:
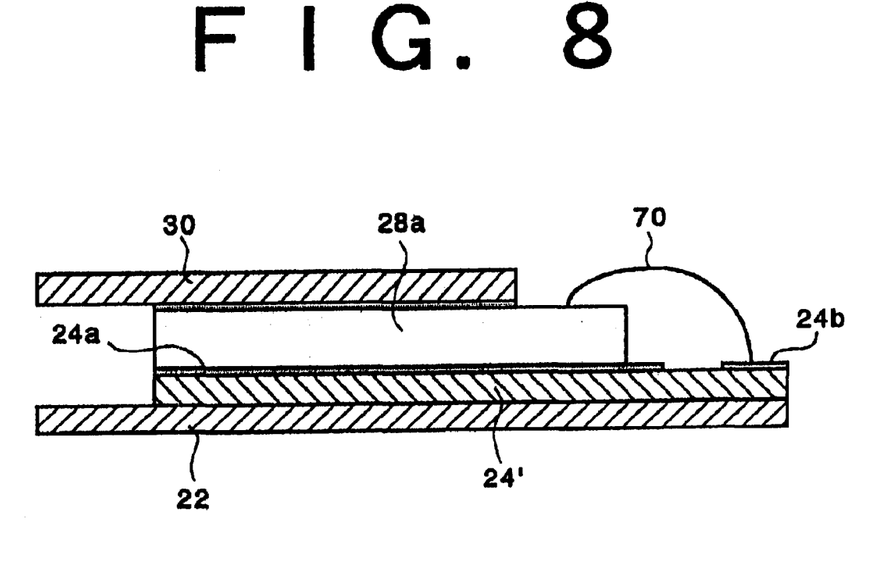
FIG. 8 is a sectional view of a bonding portion between a piezoelectric element and an electrode in the second preferred embodiment.

FIG. 8 is an enlarged sectional view of a bonding portion between the piezoelectric element 28a and the base electrode 24' in the second preferred embodiment. A first coating of a material selected from the group consisting of Au, Al, Zn, Cu, and Sn is formed on the bonding surface of the piezoelectric element 28a to the base electrode 24'. Similarly, a second coating of a material selected from the group consisting of Au, Al, Zn, Cu, and Sn is formed on the bonding surface of the base electrode 24' to the piezoelectric element 28a.

The combination of the materials of the first and second coatings is preferably set to Au/Al, Au/Al, Zn/Cu, or Sn/Cu. The first and second coatings are bonded together by placing them in close contact with each other and heating them to a given temperature under a given load applied thereto. In the case that the combination of the materials of the first and second coatings is Au/Au, the first and second coatings are bonded through a metallic bond of gold. In the case that the combination of the materials of the first and second coatings is Au/Al, Zn/Cu, or Sn/Cu, the first and second coatings are bonded through an intermetallic compound layer. The intermetallic compound layer has a thickness of about 2 $\mu$m.

Figure 9A:
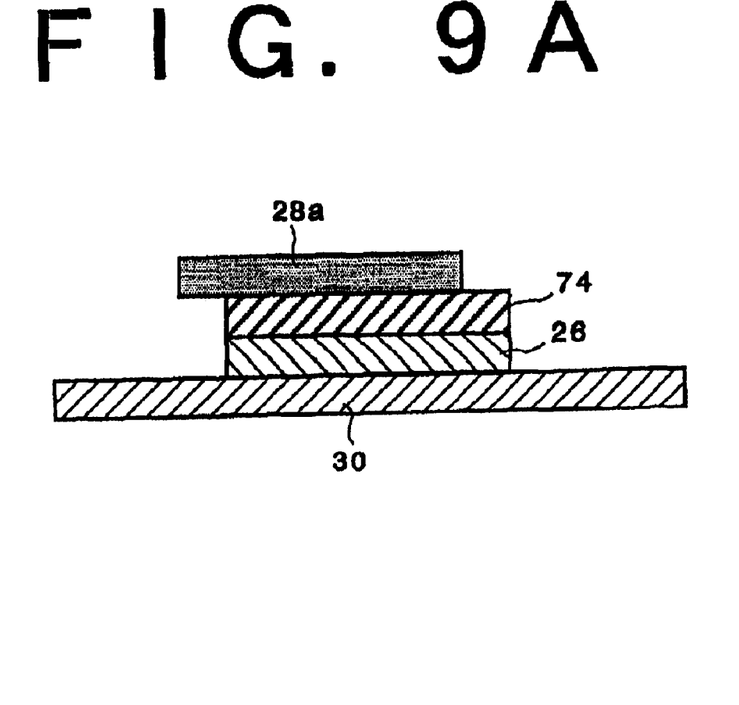
FIGS. 9A and 9B are sectional views for illustrating a self-alignment effect of solder.
Figure 9B:
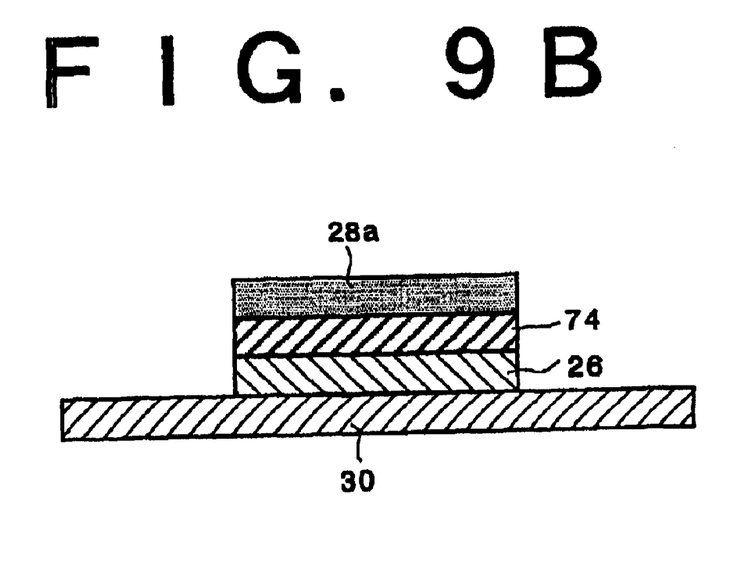

Referring to FIGS. 9A and 9B, there is shown a preferred embodiment utilizing a self-alignment effect in melting of a solder to bond the piezoelectric element 28a and the movable electrode 26. FIG. 9A shows a condition before heating. Reference numeral 74 denotes a solder paste applied to the bonding surface of the movable electrode 26 to the piezoelectric element 28a. FIG. 9B shows a condition after heating. As shown in FIG. 9B, the solder paste 74 is melted by heating to exhibit a self-alignment effect, so that the piezoelectric element 28a and the movable electrode 26 are vertically aligned by the self-alignment effect of the solder paste 74 melted, thus soldering the piezoelectric element 28a and the movable electrode 26.

Preferably, the solder paste 74 is an Sn—Pb solder (melting point: 183° C.) containing 0.1 to 10 wt. % of an element selected from the group consisting of Ag, Bi, Sb, Ge, and Ni. By the addition of such an element, the wettability of the solder can be improved to thereby increase a stress, and the melting point of the solder can be varied in the range of about 10° C. to thereby continuously generate a stress. As a result, a position correcting stress can be improved to enhance the self-alignment effect.

The solder paste 74 can be efficiently supplied by a method of supplying a fixed amount of solder paste to a necessary portion with a dispenser or by a method of printing with a metal mask. In particular, the printing method has a merit such that the solder can be supplied more stably if a squeegee is formed of the same material as that of the metal mask. Alternatively, solder plating may be carried out on the subject parts to be bonded as a pretreatment for the soldering. This pretreatment is effective in controlling the amount of solder. Further, the subject parts to be bonded may be arranged in order by using a jig or the like, thereby allowing simultaneous manufacture.

Figure 10:
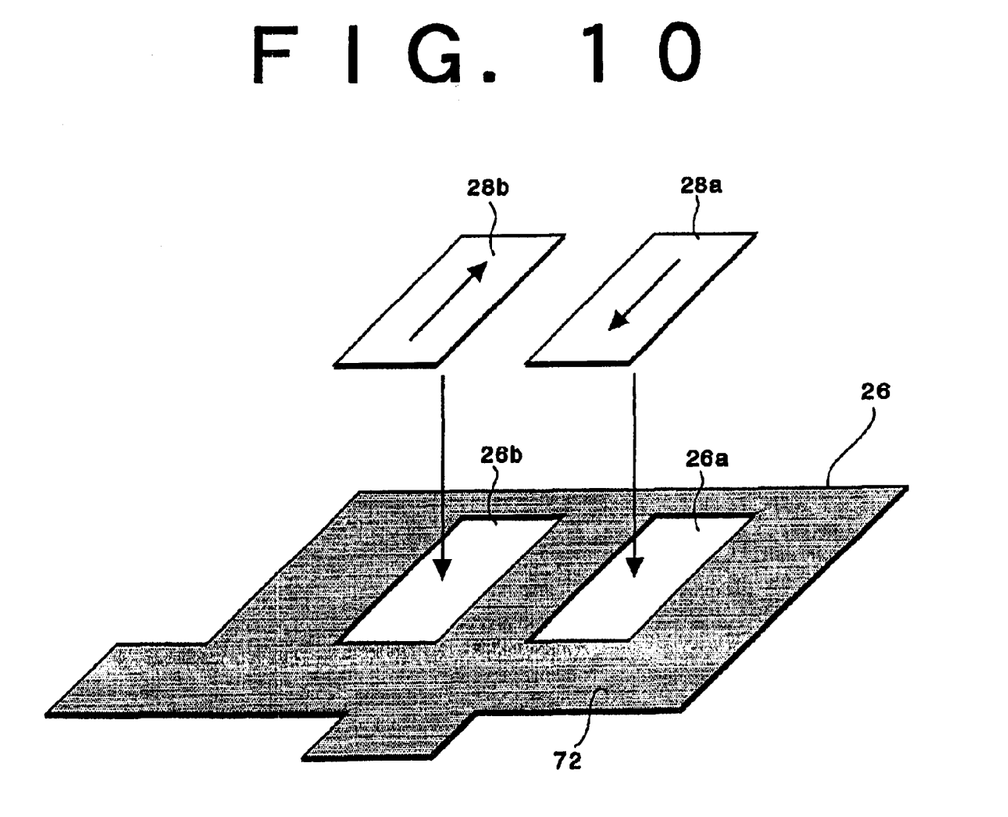
FIG. 10 is a schematic perspective view showing a preferred embodiment in which a solder resist is applied to a portion of an electrode except bonding portions.

FIG. 10 shows another preferred embodiment for obtaining effective self-alignment in soldering. As shown in FIG. 10, the shapes of bonding portions 26a and 26b of the movable electrode 26 are made coincident with the shapes of the piezoelectric elements 28a and 28b, respectively, and a solder resist 72 is applied to the other portion of the movable electrode 26. Alternatively, a Cr plating may be formed on the other portion of the movable electrode 26. A solder paste is applied to the bonding portions 26a and 26b of the movable electrode 26, and the piezoelectric elements 28a and 28b are placed on the bonding portions 26a and 26b of the movable electrode 26, respectively.

The solder paste is then heated to melt, so that the piezoelectric elements 28a and 28b are aligned (centered) with the bonding portions 26a and 26b, respectively, by the self-alignment effect of the solder due to the wetting stress in solder melting, thus obtaining a required accuracy as a product. Various Pb-free solders as shown in Table 1 may be used. As apparent from Table 1, the melting point of each Pb-free solder has a range of 20 to 30° C. Accordingly, the wetting stress in solder melting can act slowly, thereby effectively exhibiting the self-alignment effect. Further, by selecting any solder having a desired melting point, it is possible to easily support any low-heat-resistant parts and environmental issues.

TABLE 1

| Solders | Melting Point | Composition |
|---|---|---|
| Sn—Bi | 130–150° C. | Sn(bal)-Bi(0.1–60%)-In, Ag, Cu, Sb, Ge, or Zn (0.1–10%) |
| Sn—Zn | 180–200° C. | Sn(bal)-Zn(0.1–60%)-In, Ag, Cu, Sb, Ge, or Bi (0.1–10%) |
| Sn—Ag | 200–230° C. | Sn(bal)-Ag(0.1–10%)-In, Zn, Cu, Sb, Ge, or Bi (0.1–10%) |

While the melting points of the Sn—Zn and Sn—Ag lead-free solders are higher, these lead-free solders are potential solder materials from the viewpoint of bonding reliability in the case that the heat-resistance temperature of the piezoelectric elements will be improved in the future.

According to the present invention, the bonding of a piezoelectric element and an electrode for applying a voltage can be reliably attained, and it is possible to eliminate the need for manpower and installation associated with the application of adhesive in the prior art. Further, according to the bonding method of the present invention, the thickness of a piezoelectric microactuator as a product can also be controlled, so that it is possible to assemble a higher-precision piezoelectric microactuator.

What is claimed is:

1. A method of bonding a piezoelectric element and an electrode, comprising the steps of:

forming a solder resist on a bonding surface of said electrode except a mounting portion for said piezoelectric element; and soldering said piezoelectric element and said electrode at said mounting portion.

2. A method of bonding a piezoelectric element and an electrode, comprising the steps of:

preparing a Sn—Pb solder containing less than 5 wt. % of a material selected from the group consisting of Ag, Bi, Sb, Ge, and Ni; and soldering said piezoelectric element and said electrode by using said Sn—Pb solder.

* * * * *